United States Patent

Miller et al.

[15] 3,662,379

[45] May 9, 1972

[54] DIGITAL-TO-RESOLVER CONVERTER

[72] Inventors: George W. Miller, Anoka; Charles J. Wacker, New Brighton; James B. Dietel, Minneapolis, all of Minn.

[73] Assignee: FMC Corporation, San Jose, Calif.

[22] Filed: Dec. 29, 1969

[21] Appl. No.: 888,688

[52] U.S. Cl. ..................................340/347 DA, 340/347 SY

[51] Int. Cl. ..................................H03r 13/02

[58] Field of Search ..............340/347 DA, 347 SY; 318/600, 318/601, 603; 307/299, 242; 235/179

[56] References Cited

UNITED STATES PATENTS

| | | | |
|---|---|---|---|
| 2,803,003 | 8/1957 | Pfeiffer | 340/347 DA |
| 2,849,668 | 8/1958 | Tripp | 340/347 DA |
| 3,366,804 | 1/1968 | Heaviside | 340/347 DA |
| 3,493,735 | 2/1970 | Heaviside et al | 237/179 |
| 3,509,556 | 4/1970 | Schmidt | 340/347 DA |
| 2,901,638 | 8/1959 | Huang | 307/299 |
| 3,531,658 | 9/1970 | Chong | 307/242 X |
| 3,544,994 | 12/1970 | Hanson et al. | 340/347 DA |

*Primary Examiner*—Thomas A. Robinson

*Attorney*—F. W. Anderson and C. E. Tripp

[57] ABSTRACT

A converter accepts a digital signal comprising a binary representation of a given angle and provides an analog output for a resolver comprising a pair of voltages proportional to the sine and the cosine of that angle. The voltages are derived from a first transformer by taps in the circuits of a pair of secondaries of the transformer with such taps comprising transistor switching elements controlled by conventional binary-to-decimal decoder/drivers, and there are two additional multitapped transformers serially connected with each of said secondaries for adding in incremental voltages in order to obtain a high degree of resolution.

10 Claims, 10 Drawing Figures

INVENTORS
GEORGE W. MILLER
CHARLES J. WACKER
JAMES B. DIETEL

BY F.W. Anderson
C.E. Tripp
ATTORNEYS

| INPUT | | | | | OUTPUT 1 | | | | | OUTPUT 2 | | | | | QUAD SWITCH | TI SWITCH |
|---|---|---|---|---|---|---|---|---|---|---|---|---|---|---|---|---|
| 11 | 10 | 9 | 8 | 7 | D1 | C1 | B1 | A1 | OUT | D2 | C2 | B2 | A2 | OUT | | |
| 0 | 0 | 0 | 0 | 0 | 1 | 0 | 0 | 0 | 8 | 0 | 0 | 0 | 0 | 0 | S1 | S5 |
| 0 | 0 | 0 | 0 | 1 | 1 | 0 | 0 | 0 | 8 | 0 | 0 | 0 | 1 | 1 | S1 | S6 |
| 0 | 0 | 0 | 1 | 0 | 1 | 0 | 0 | 0 | 8 | 0 | 0 | 1 | 0 | 2 | S1 | S7 |
| 0 | 0 | 0 | 1 | 1 | 1 | 0 | 0 | 0 | 8 | 0 | 0 | 1 | 1 | 3 | S1 | S8 |
| 0 | 0 | 1 | 0 | 0 | 1 | 0 | 0 | 0 | 8 | 0 | 1 | 0 | 0 | 4 | S1 | S9 |
| 0 | 0 | 1 | 0 | 1 | 1 | 0 | 0 | 0 | 8 | 0 | 1 | 0 | 1 | 5 | S1 | S10 |
| 0 | 0 | 1 | 1 | 0 | 1 | 0 | 0 | 0 | 8 | 0 | 1 | 1 | 0 | 6 | S1 | S11 |
| 0 | 0 | 1 | 1 | 1 | 1 | 0 | 0 | 0 | 8 | 0 | 1 | 1 | 1 | 7 | S1 | S12 |
| 0 | 1 | 0 | 0 | 0 | 0 | 0 | 0 | 0 | 0 | 1 | 0 | 0 | 0 | 8 | S2 | S13 |
| 0 | 1 | 0 | 0 | 1 | 0 | 0 | 0 | 1 | 1 | 1 | 0 | 0 | 0 | 8 | S2 | S12 |
| 0 | 1 | 0 | 1 | 0 | 0 | 0 | 1 | 0 | 2 | 1 | 0 | 0 | 0 | 8 | S2 | S11 |
| 0 | 1 | 0 | 1 | 1 | 0 | 0 | 1 | 1 | 3 | 1 | 0 | 0 | 0 | 8 | S2 | S10 |
| 0 | 1 | 1 | 0 | 0 | 0 | 1 | 0 | 0 | 4 | 1 | 0 | 0 | 0 | 8 | S2 | S9 |
| 0 | 1 | 1 | 0 | 1 | 0 | 1 | 0 | 1 | 5 | 1 | 0 | 0 | 0 | 8 | S2 | S8 |
| 0 | 1 | 1 | 1 | 0 | 0 | 1 | 1 | 0 | 6 | 1 | 0 | 0 | 0 | 8 | S2 | S7 |
| 0 | 1 | 1 | 1 | 1 | 0 | 1 | 1 | 1 | 7 | 1 | 0 | 0 | 0 | 8 | S2 | S6 |
| 1 | 0 | 0 | 0 | 0 | 1 | 0 | 0 | 1 | 9 | 0 | 0 | 0 | 0 | 0 | S3 | S5 |
| 1 | 0 | 0 | 0 | 1 | 1 | 0 | 0 | 1 | 9 | 0 | 0 | 0 | 1 | 1 | S3 | S6 |
| 1 | 0 | 0 | 1 | 0 | 1 | 0 | 0 | 1 | 9 | 0 | 0 | 1 | 0 | 2 | S3 | S7 |
| 1 | 0 | 0 | 1 | 1 | 1 | 0 | 0 | 1 | 9 | 0 | 0 | 1 | 1 | 3 | S3 | S8 |
| 1 | 0 | 1 | 0 | 0 | 1 | 0 | 0 | 1 | 9 | 0 | 1 | 0 | 0 | 4 | S3 | S9 |
| 1 | 0 | 1 | 0 | 1 | 1 | 0 | 0 | 1 | 9 | 0 | 1 | 0 | 1 | 5 | S3 | S10 |
| 1 | 0 | 1 | 1 | 0 | 1 | 0 | 0 | 1 | 9 | 0 | 1 | 1 | 0 | 6 | S3 | S11 |
| 1 | 0 | 1 | 1 | 1 | 1 | 0 | 0 | 1 | 9 | 0 | 1 | 1 | 1 | 7 | S3 | S12 |
| 1 | 1 | 0 | 0 | 0 | 0 | 0 | 0 | 0 | 0 | 1 | 0 | 0 | 1 | 9 | S4 | S13 |
| 1 | 1 | 0 | 0 | 1 | 0 | 0 | 0 | 1 | 1 | 1 | 0 | 0 | 1 | 9 | S4 | S12 |
| 1 | 1 | 0 | 1 | 0 | 0 | 0 | 1 | 0 | 2 | 1 | 0 | 0 | 1 | 9 | S4 | S11 |
| 1 | 1 | 0 | 1 | 1 | 0 | 0 | 1 | 1 | 3 | 1 | 0 | 0 | 1 | 9 | S4 | S10 |
| 1 | 1 | 1 | 0 | 0 | 0 | 1 | 0 | 0 | 4 | 1 | 0 | 0 | 1 | 9 | S4 | S9 |
| 1 | 1 | 1 | 0 | 1 | 0 | 1 | 0 | 1 | 5 | 1 | 0 | 0 | 1 | 9 | S4 | S8 |
| 1 | 1 | 1 | 1 | 0 | 0 | 1 | 1 | 0 | 6 | 1 | 0 | 0 | 1 | 9 | S4 | S7 |
| 1 | 1 | 1 | 1 | 1 | 0 | 1 | 1 | 1 | 7 | 1 | 0 | 0 | 1 | 9 | S4 | S6 |

FIG. 8

DIGITAL-TO-RESOLVER CONVERTER

BACKGROUND OF THE INVENTION

1. Field of the Invention

The present invention pertains to digital-to-analog conversion units for converting digital input information to resolver output voltages, and more particularly, it pertains to a digital-to-resolver converter of a type which uses a multitapped transformer unit for performing the basic conversion operation.

2. Description of the Prior Art

Because of the greatly increased use of digital computers in recent years, there has been a continual and growing demand for conversion units capable of interfacing between digital and analog systems. One such area of development has been in the field of digital-to-resolver converters or the related field of digital-to-synchro converters. For example, in fire control systems used by the military, resolver and synchro systems are usually required for control of the servomechanisms that drive the gun mounts, and conversion equipment must be provided which will accept digital fire control signals, such as might be obtained from a multipurpose computer, and which will convert such digital information into resolver or synchro voltages.

One basic approach to this general conversion problem has been the use of "semi-digital" servo-mechanisms which require sampled data techniques, sophisticated filter theory, and the application of shaft-angle encoders and encoder logic circuitry for applying the digital input signals to the control of a mechanical output such as a rotatable shaft. Such electromechanical conversion devices are generally designed only for specific applications and, therefore, lack the adaptability necessary in view of the present rapidly advancing technology where both systems and individual components are continually being modified and upgraded. The former devices also present problems in reliability, particularly in systems requiring high resolution, and, obviously, require complex and costly mechanisms in order to function at adequate response rates.

In more recent years, interest has turned to all-electronic approaches to digital-to-resolver conversion with the increased reliability of low-cost solid state circuitry. A particularly desirable characteristic of such converters in their universal adaptability, i.e., their ability to function in a variety of different systems with but minor changes to the parts thereof. Further, such digital-to-resolver converters should be simple so that they might be packaged in a single unit or on a single PC card, for example, whereby their complete operation can be conveniently checked and their reliability and response accurately evaluated.

The basic circuits for performing digital-to-resolver conversion operations are usually inductive or resistive tapped voltage dividers. By switching the tapped points as a function of the digital input signal sinusoidal functions can be generated which vary with the digital input in the desired manner. A problem with the prior art circuits of this type has been the degree of resolution which may be obtained without resorting to unduly large and/or expensive components. For example, a high degree of resolution normally requires both an unduly large number of switching devices and large transformer units in order that a clear distinction can be maintained between slight variations in the magnitude of the output voltages.

A further problem with the prior devices of the foregoing type is presented by the fact that the proportional sine and cosine voltages to be generated can vary only within a single quadrant, i.e., a 90° angle, while all four quadrants, or 360°, must be represented in continuous form in the output voltages; consequently, switching difficulties are encountered which result in the generation of transient voltages that can lead to damage to the circuitry, particularly to the transformer windings, and to errors in the output voltages while operating at the quadrant switching points.

SUMMARY OF THE INVENTION

With the circuitry of the present invention, a converter is provided which utilizes a plurality of tapped transformers for providing output voltage signals that are proportional to the sine and the cosine of the desired angle as determined by a digital input signal. A first transformer is used to provide voltages representing the sine and cosine of a primary angle, and a second pair of transformers are used to add in additional voltages representing an incremental angle added onto the primary angle in order to obtain better resolution without resorting to larger transformers. The operation of these second transformers is determined by a special trigonometric relationship. The primary of each of the second transformers receives a voltage representing the sine (or cosine) of the primary angle. Each of the second transformers is provided with two secondaries one picking off the full voltage on the primary with the other picking off a portion thereof proportional to the tangent of the desired incremental angle. The secondaries are then cross connected such that the sine (or cosine) of the primary angle is added to the product of the cosine (or sine) of the primary angle times the tangent of the incremental angle. The summation of these angles, at the outputs of the second transformers, is then proportional to the sine (or cosine) of the sum of the primary angle and the incremental angle in accordance with standard trigonometric relationships.

The present invention also solves the manner of switching the sines and cosines between quadrants, where they change sign, such switching being accomplished in a unique manner so that no transient or DC voltages are caused to pass through the transformer windings during the switching from one quadrant to the next. Double-pole switches are used at the ends of the primary windings for the second transformers with the voltage from the first transformer being center-tapped thereto. In this way only half of each second transformer primary will be switched into operation at any time and this half will be at zero voltage at the time that it is switched in.

BRIEF DESCRIPTION OF THE DRAWINGS

FIG. 8 is a truth table illustrating the logic of the circuitry of FIG. 7 and the manner in which the switches to the primary transformer, as shown in FIG. 2, are operated.

DESCRIPTION OF THE PREFERRED EMBODIMENT

Figure 1:
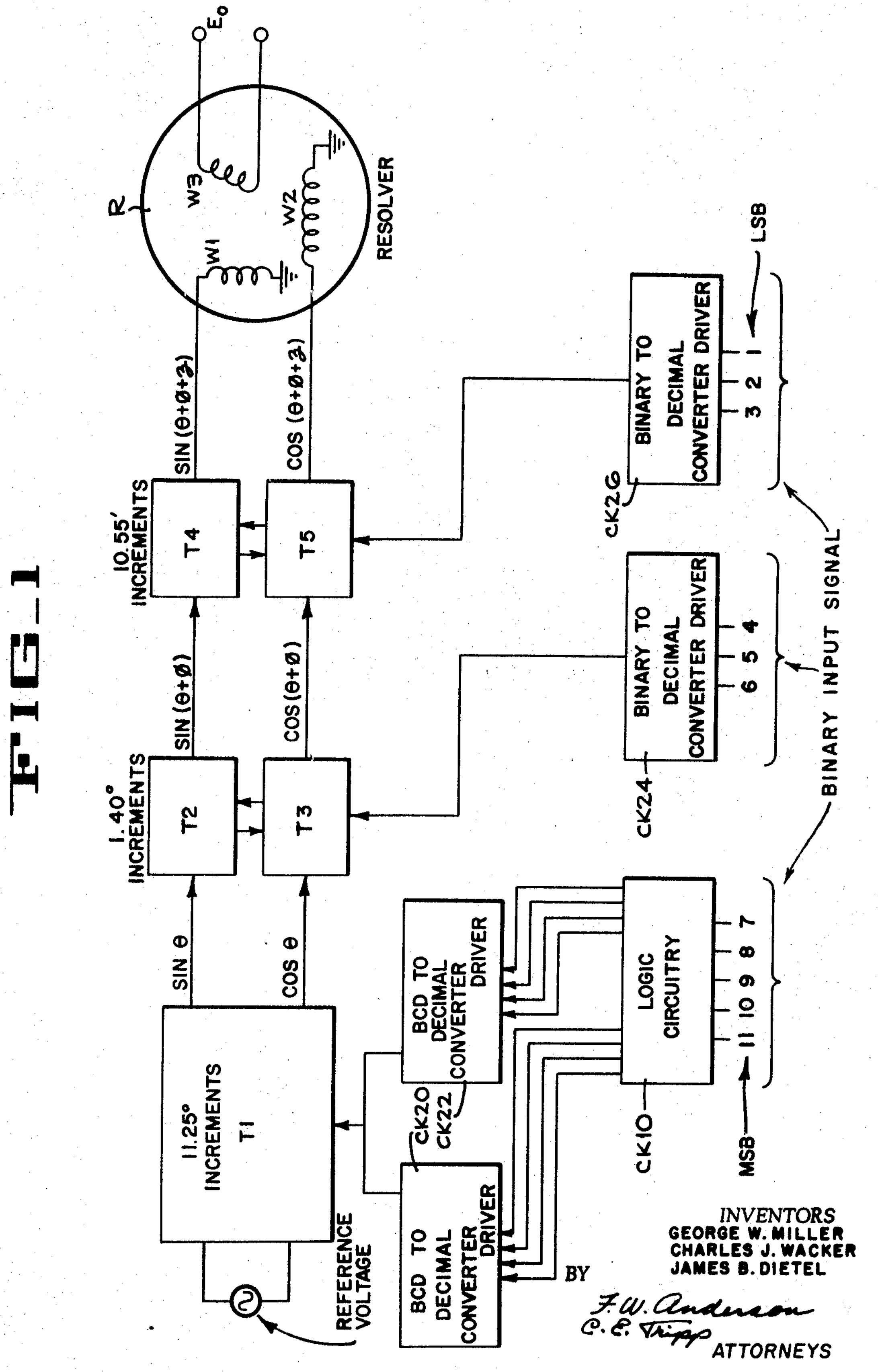
FIG. 1 is a basic block diagram representation of the digital-to-resolver circuitry of the present invention.

Referring now more particularly to the drawings, FIG. 1 is a block diagram representation of the basic circuitry of the digital-to-resolver converter of the present invention. In the embodiment of the invention which is diagrammatically depicted therein, an 11-bit binary control signal, representing a particular reference angle, is provided for a finite time period at a suitable digital output device such as a holding register (not shown). The numbers 1 through 11 at the bottom of FIG.

1 indicate the bits which contain the coded information designating the reference angle. The binary representation of the reference angle is carried out in a conventional binary code manner, i.e., by letting each bit represent the division by two of the angle indicated by the next higher ordered bit. For example, the most significant bit (bit number 11) will represent an angle of 0° or 180° depending upon whether or not the bit is in the "0" state or in the "1" state, respectively. The next most significant bit (bit number 10) represents 0° or 90°, while the next most significant bit (bit number 9) represents 0° or 45° , etc. The summation of all of the bits thereby indicates the angle represented at the digital input to the converter. In the depicted embodiment of the invention, there are $2^{11}$ or 2,048 discrete angles selectable by the 11-bit digital input thereby providing a resolution of 10.55 minutes of arc.

The five most significant bits of the digital input are provided as inputs to logic circuitry CK10 which performs a logic translation thereon to provide a pair of four-bit binary coded outputs which are transmitted to BCD-to-decimal converter/drivers CK20 and CK22. The outputs of the BCD-to-decimal converters control a plurality of switches in the secondary windings of a basic control transformer T1 to permit appropriate voltages representing the sine and the cosine of a primary angle $\theta$ to be transmitted therefrom. With the five most significant bits, it will be appreciated that the primary angle will be an angle which is a multiple of 11.25° increments and will be equal to or less than (within 11.25° of) the reference angle. The transformer is driven by a reference AC voltage source of a predetermined amplitude which voltage is applied to the primary winding of the transformer.

The next most significant three bits (bits 4, 5 and 6) of the binary control signal are directed to a binary-to-decimal converter/driver CK24 which controls the switching functions of the secondary taps in a pair of transformers T2 and T3. The secondaries of the transformers T2 and T3 are cross-connected so that incremental voltages are added to the voltages received from the transformer T1 which incremental voltages are related to an incremental angle $\phi$ which is indicated by the binary input to the transformers T2 and T3. The addition of the incremental voltages is such that the output of these transformers is a pair of voltages which are proportional to the sine and to the cosine of the sum of the primary angle $\theta$ and the incremental angle $\phi$. The operation performed by transformers T2 and T3 thereby results in a resolution of 1.4°.

A similar incrementing operation is provided by a further pair of transformers T4 and T5 which add additional voltages corresponding to angular increments of 10.55 minutes to the voltages corresponding to the summation of the incremental angles $\theta$ and $\phi$ obtained from the transformers T1, T2 and T3. The least significant three bits of the binary input signal are provided at the inputs of a binary-to-decimal converter driver CK26 the output of which operates to control the switches in the secondary taps of the transformers T4 and T5 in the same manner as are the switches in the circuits of transformers T2 and T3. By the interconnection of the secondary windings of transformers T4 and T5, in a manner to be explained more fully hereinafter, the voltage outputs of the transformers will be proportional to the sine and to the cosine of an angle represented by the summation of the three incremental angles $\theta$, $\phi$ and $\zeta$ with the smallest incremental angle $\zeta$ corresponding to the angle represented by the three least significant bits of the binary control signal.

In the conventional manner the sine and cosine voltages are applied to the two stator windings W1 and W2 of a resolver R. The resolver includes a rotor having a third winding W3 which will have a voltage $E_o$ impressed thereon corresponding to the sin of the angle represented by the difference between the angle $(\theta + \phi\ \zeta)$ on the stator windings and the angle of the rotor. The rotor of the resolver thereby serves as the means for reading the angle represented by the binary control signal at the digital input to the converter.

The description of the circuitry of the present invention will cover, first, the transformers, which comprise the basic functional components of the circuitry of the present invention, and the manner in which the sines and cosines of the desired angles are derived; secondly, the description of the solid state switching circuitry; and, finally, the logic circuitry for converting the binary input signals to decimal signals to control the switching.

Figure 2:
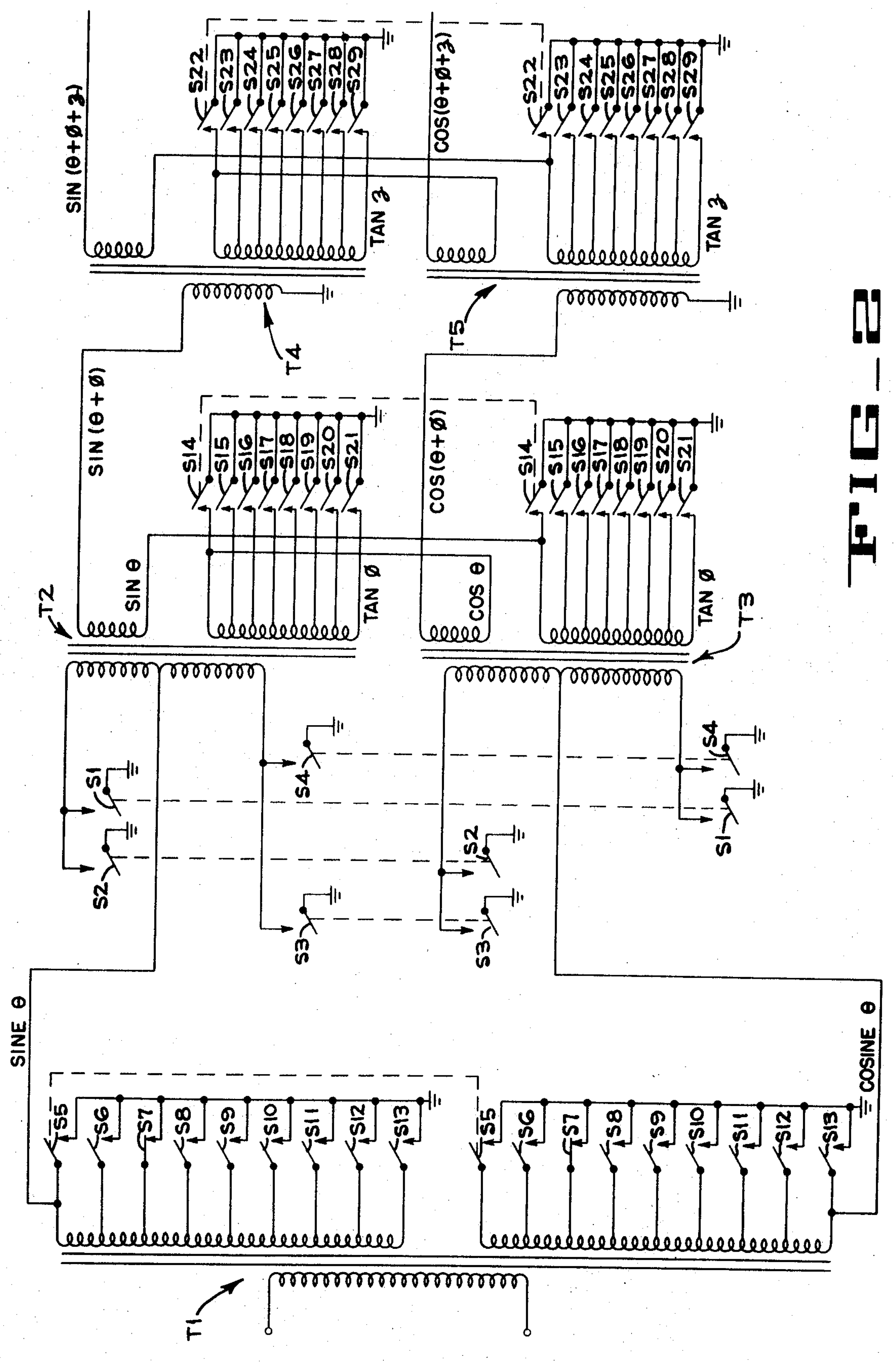
FIG. 2 is a diagrammatic representation of the transformer circuitry of the present invention with the switches being only functionally depicted.

Referring now to FIG. 2, it will be seen that the primary of the transformer T1 is directly excited by the reference input voltage. This voltage is converted into two output voltages at the secondaries of the transformer which voltages will represent the sine and cosine of a selected angle. It will be noted that nine switches S5 through S13 are utilized in the taps to the secondary windings of the transformer and that four switches, S1, S2, S3 and S4, are used in switching the outputs of the secondary windings to the primaries of the second set of transformers T2 and T3. Each switch is illustrated only diagrammatically in its functional configuration in FIG. 2 and is seen to comprise a double-pole switch having contacts in the taps to each of the secondaries of T1.

By selecting the proper turn ratios between the taps on the secondary windings, the output voltages will be specified percentages of the reference input voltage. Since the outputs are to be proportional to values of the sine and the cosine functions, the turn ratios should be selected so that each adjacent switch will permit a voltage to be switched into the associated secondary winding which increases or decreases the value of the sinusoidal function generated by the incremental angle, i.e., 11.25°, indicated between switching point. By way of example, if there are 1,128 turns on the primary of T1, then each of the secondary windings should be provided with a similar number of turns divided by the taps into groups of 22, 68, 98, 142, 170, 198, 210 and 220 turns with the sine winding beginning (between S5 and S6) with the highest number, i.e., 220 turns, and with the cosine winding beginning (between S5 and S6) with the lowest number, i.e., 22 turns.

Each of the taps in the secondaries of T1 thereby provides sine and cosine values for eight equally spaced angles from 0° to 90°, representing one quadrant of the four possible quadrants making up the necessary 360° angular output. A particularly important part of the present invention lies in the means by which the different quadrants are chosen and, particularly, the means for switching between quadrants without inducing large transient voltages on the transformer windings which might cause damage thereto. The double-pole switches S1 through S4 are utilized for this purpose and are connected as shown in FIG. 2 with each switch having one contact grounding an end of one of the primary windings of transformers T2 or T3.

Figures 3, 3A, 3B:
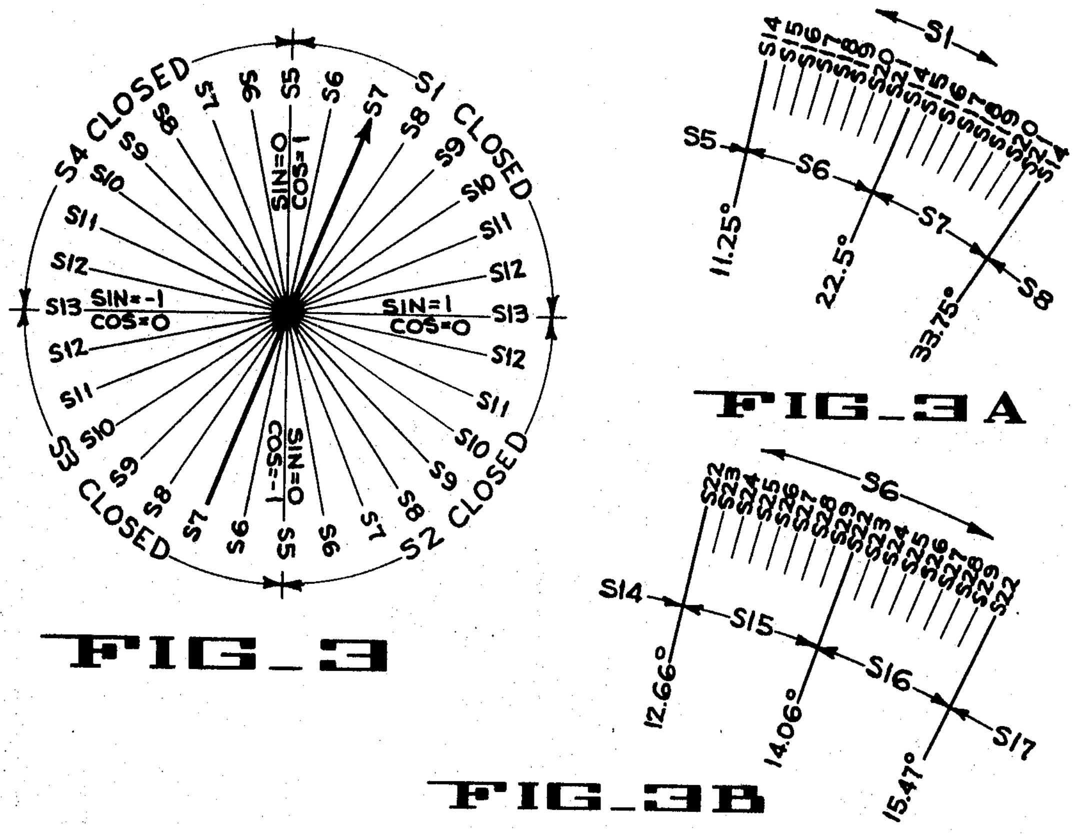
FIG. 3 is a schematic illustration of the resolver output.
FIG. 3A is an enlarged detail view of a portion of the resolver output shown in FIG. 3.
FIG. 3B is an enlarged detail view of a portion of the resolver output shown in FIG. 3A.

To illustrate the manner in which the switches S1 through S4 are utilized, and making special reference to the illustrated resolver output of FIG. 3, it will be noted that for an angle of 0° (or 360° ) wherein the sine equals 0 and the cosine equals 1, S1 will be closed and, in moving clockwise through the resolver output, the switches will sequentially close from S5 through S13 to indicate angles from 0° to 90° at 11.25° angular increments. At exactly 90°, switch S1 will open and switch S2 will close thereby causing the cosine to reverse polarity. Proceeding to 180°, the switches will close from S13 at 90° to S5 at 180°. At 180°, switch S2 will open and switch S3 will close, this time causing the sine to change polarity while the cosine moves through the 0 point. Proceeding to 270°, the switches will close from S5 at 180° to S13 at 270°. At 270°, the cosine again changes sine by the opening of switch S3 and the closing of switch S4. From 270° to 0° the switches will close from S13 at 270° to S5 0°. It will be noted that the sine changes polarity at 0° and 180° where its value is 0. Likewise, the cosine changes polarity at 90° and 270° where its value is 0. By switching polarities at these points the primaries of transformers T2 and T3 are not subjected to large transient voltages. That is to say, when any of the switches S1 through S4 are closed, the voltage through the switch will be zero so that the primaries of transformers T2 and T3 will not be subjected to a sudden current surge.

A particularly important feature of the present invention is the manner in which additional voltages, representing incremental angles, are added to the voltages representing the primary angle $\theta$ at the secondaries of transformer T1. As shown in FIG. 3A representing the resolver output, each of the 11.25° angular increments is subdivided further into eight equal angular increments controlled by the switches S14 through S21. These switches are also double-pole switches having contacts in separate secondary windings of each of the transformers T2 and T3. It will be seen that each of the transformers T2 and T3 is provided with two secondary windings one of which is provided with the same number of turns as the halves of the primary winding upon which the voltage from T1 is impressed so that this secondary will receive the full voltage representing either the sine $\theta$ or the cosine $\theta$ transferred from the transformer T1. The other secondary winding of each of the transformers T2 and T3 is provided with a smaller number of turns and has a plurality of taps thereto dividing the winding into eight equal sectors. The secondaries of the transformers T2 and T3 are cross-coupled such that a specified portion of the cosine function from T3 is added to the sine function on T2 and a specified portion of the sine function from T2 is added to the cosine function on T3.

In order to add the correct amount of voltage to each of the voltages representing the sinusoidal functions of the primary angle $\theta$, i.e., in order to add incremental voltages corresponding to the incremental angle $\phi$ indicated by the binary input on bits 4–6, the tapped secondary windings of T2 and T3 are provided with a number of turns such that the voltage developed thereon will correspond to the tangent of the incremental angle $\phi$ times the voltage applied to the primary of these transformers which will represent a sinusoidal function. For example, if the primaries of T2 and T3 have 1,300 turns, then one secondary of each will also have 1,300 turns while the tapped secondary of each will have 224 turns divided into seven 32-turn segments by the switches S14 through S21. It will be noted that since the tangent of a small angle varies in a nearly linearly fashion, the turn ratios for the 1.4° segments can be maintained constant and, therefore, errors are not incurred because of the reversing of the quadrant switches S1–S4. The tap switches S14–S21 serve to ground the selected portion of the secondary winding while the other end thereof is directed to one of the third set of transformers T4 or T5.

It will be noted the cross-connections of the secondaries that the output from transformer T2 will be equal to $$\sin\theta \pm \cos\theta \tan\phi$$

Likewise, the output of transformer T3 will be equal to $$\cos\theta \mp \sin\theta \tan\phi$$

From the trigonometric identity, Tan $\phi$ = sin $\phi$ divided by the cos $\phi$, the outputs become $$\sin\theta \pm \frac{\cos\theta \sin\phi}{\cos\phi} = \frac{\sin\theta\cos\phi \pm \cos\theta\sin\phi}{\cos\phi}$$

and $$\cos\theta \pm \frac{\sin\theta \sin\phi}{\cos\phi} = \frac{\cos\theta\cos\phi \pm \sin\theta\sin\phi}{\cos\phi}$$

These functions can be further simplified so that the outputs become $$\sin(\sigma \pm \phi)/\cos\phi \text{ and } \cos(\theta \pm \phi)/\cos\phi$$

Therefore, the outputs will be proportional to sin $(\theta \pm \phi)$ and cos $(\theta \pm \phi)$ so that the resultant angle generated by the combination of T1, T2 and T3 becomes the sinusoidal function of the primary angle $\theta$ plus the incremental angle $\phi$. In terms of the present embodiment, this means that the transformers T2 and T3 add voltages to the voltages generated in T1 such that the sinusoidal functions are increased by values which correspond to multiples of 1.4°. If the highest switch S21 is closed, for example, the voltages to the primaries of T4 and T5 will be proportional to the sine (or cosine) of $\theta + 9.8°$.

Transformers T4 and T5 operate in precisely the same manner as the transformers T2 and T3 with the exception that there is no quadrant switching in the primaries thereof. For example, the primaries of the transformers T4 and T5 are provided with a voltage proportional to the sine of $(\theta + \phi)$ and the cosine of $(\theta + \phi)$, respectively. Each of the transformers has two secondary windings, one matching the turns of the primary and receiving directly the full voltage on the primary and the other winding being a tapped secondary adding in the incremental voltage representing the tangent of a second incremental angle $\zeta$ indicated by the least significant bits (1–3) of the digital order signal. The secondaries are cross-coupled and, by the trigonometric formulas set forth hereinbefore, the output of each of the transformers T4 and T5 represents the summation of two secondary windings and is a voltage which will be proportional to the sine or cosine of the summation of the angles $\theta$, $\phi$ and $\zeta$.

The double-pole switches S22 through S29 ground the secondary windings which correspond to the tangent of the angle $\zeta$ which angle, in the embodiment of the present invention is comprised of a predetermined portion of seven equal 10.55 minute sectors. The maximum angle $\zeta$ will therefore be 1.4° 10.55 minutes or approximately 1° 13.5 minutes. By way of example, if there are 1,304 turns in the primaries of T4 and T5, the tapped secondaries will be provided with 28 turns divided into four turn segments by the switches S22–S29. For a further description of the operation of T4 and T5 reference is made to the foregoing description of the operation of T2 and T3. From FIG. 3 is will be noted that T4 and T5 further subdivide the output into 10.55 minute segments. It will be obvious that further resolution could be obtained by providing additional sets of transformers at the output in the configuration of transformers T4 and T5.

Figure 5:
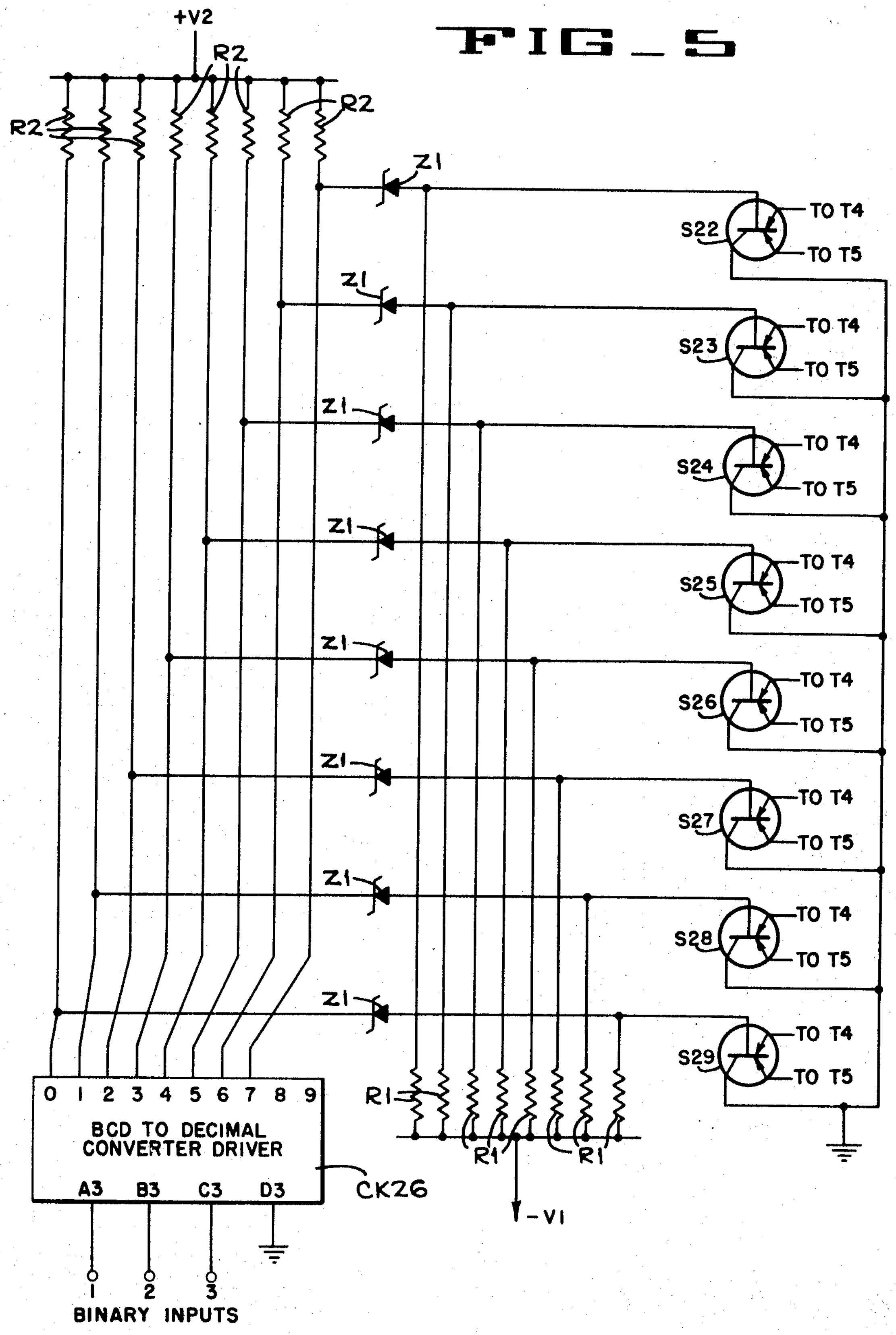
FIG. 5 is an electrical schematic diagram of the circuitry for operating certain of the transformer switches shown in FIG. 2.
Figure 6:
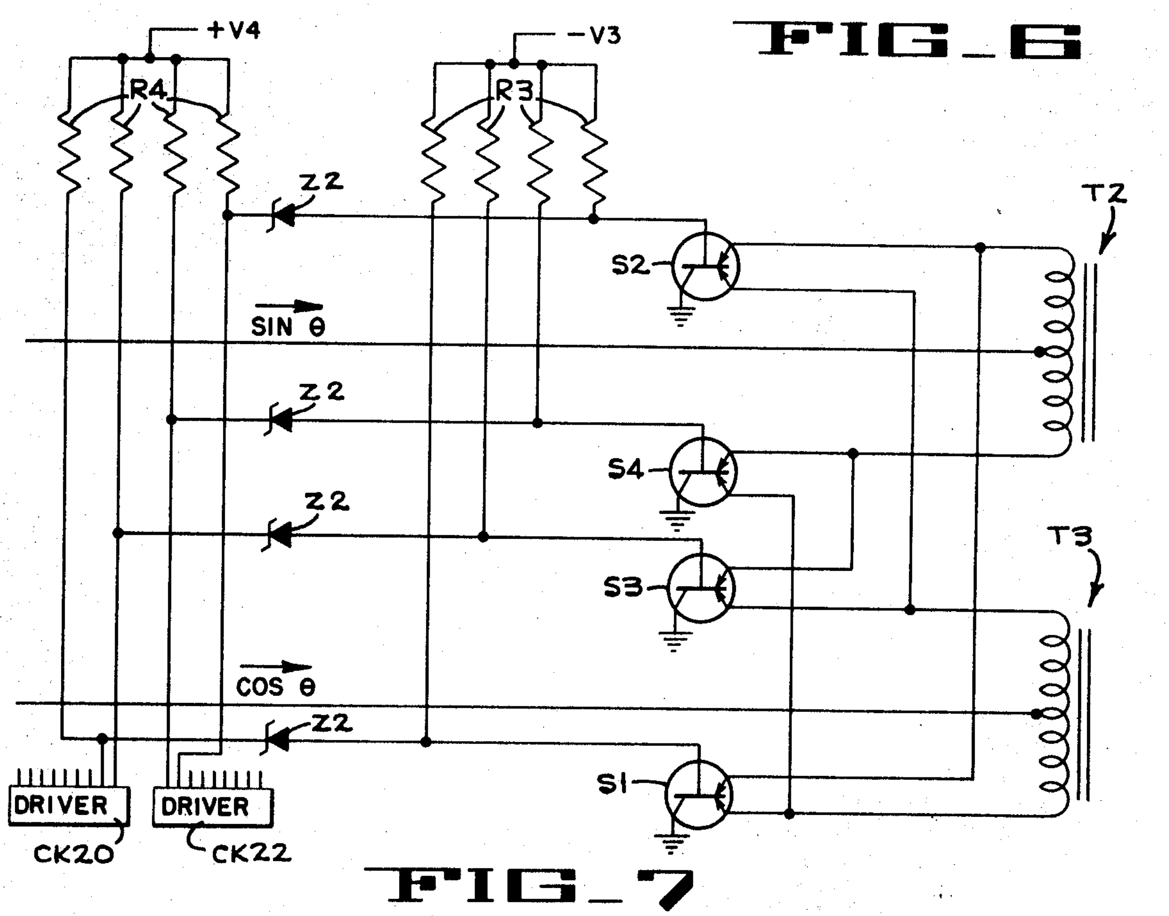
FIG. 6 is an electrical schematic diagram of the biasing circuitry for the quadrant switches shown in FIG. 2.

Another feature which considerably increases the utility of the converter of the present invention is the use of special solid state transistor switches to provide for each of the switches S1 through S29. As has been pointed out, each of these switches is a double-pole switch, i.e., each switch has contacts which open and close in separate circuits. Normally 58 bipolar transistors would be required in order to carry out each separate switching operation. However, a solid state integrated chopper transistor has recently been developed by Crystalonics, a Division of Teledyne, Inc., 147 Sherman Street, Cambridge, Massachusetts, which transistor has been discovered to have uniquely adaptable characteristics for use in the converter circuitry of the present invention. This bipolar transistor, identified by JEDEC No. 3N136, has two electrically-isolated emitters and is illustrated schematically in the circuit diagrams of FIGS. 5 and 6. FIG. 5 shows the circuitry for switches S22 through S29 for picking the voltages from the secondaries of transformers T4 and T5. FIG. 6 shows the circuitry for the quadrant switches S1 through S4. It will be appreciated that the biasing and circuit arrangements for the transistor switches S5 through S21 are similar to those shown in FIG. 5 for the switches S22 through S29.

The transistor switches are bipolar in nature so that an AC load voltage can be handled thereby. When the switch is in the "off" condition, i.e., when the lead from the driver circuits CK20, CK22, CK24 or CK26 is open, the transistor will be biased such that the voltage on the base is more positive than the peak AC voltage on the transformer windings, i.e., the peak value of the input reference voltage to T1. During the "off" condition both emitters are isolated from ground and from each other and no signal will be passed through the transistor. When the transistor is switched on by the application of a small voltage from the driver circuit lead, the base goes negative so that a base current will be permitted to flow.

In FIG. 5, the biasing arrangement for the switches S22 through S29 is shown. Each of these switches has its base lead connected to the anode of a zener diode Z1 and to a base biasing resistor R1 to which a negative biasing voltage −V1 is applied. The cathode of the zener diode is connected to the appropriate input from the driver circuitry CK26 and through a biasing resistor R2 to a positive biasing voltage V2. During the "off" condition, i.e., when the lead to the circuitry CK26 is open, reverse current flow through the zener diode will maintain the base at a sufficiently positive value to prevent any base current from flowing. When the appropriate line from the driver is closed and a small voltage is applied thereto, the zener diode blocks the voltage from V2, except for a small leakage current, and base current will flow through the biasing resistor R1 to the negative potential −V1 thus turning the transistor "on" by grounding the emitters thereof and permitting current flow in the associated transformer winding segment.

FIG. 6 shows the biasing arrangement for the quadrant switches S1 through S4. Since the primary windings of T2 and T3 are driven from their centers as shown, the ungrounded end of the windings will develop twice the input voltage. It is necessary, therefore, that the switches S1 through S4 be biased to handle at least twice the reference voltage in order to assure turn off. The biasing arrangement, however, can be done in the same manner as that previously shown wherein a negative voltage −V3 is applied through a biasing resistor R3 to the base terminal while the driver input from circuitry CK20 or CK22 is applied through a zener diode Z2 to the base. During the "off" condition, a positive voltage V4 applied through the biasing resistor R4 raises the voltage at the base to a value above the peak of the maximum AC input voltage to prevent turn-on.

Figure 4:
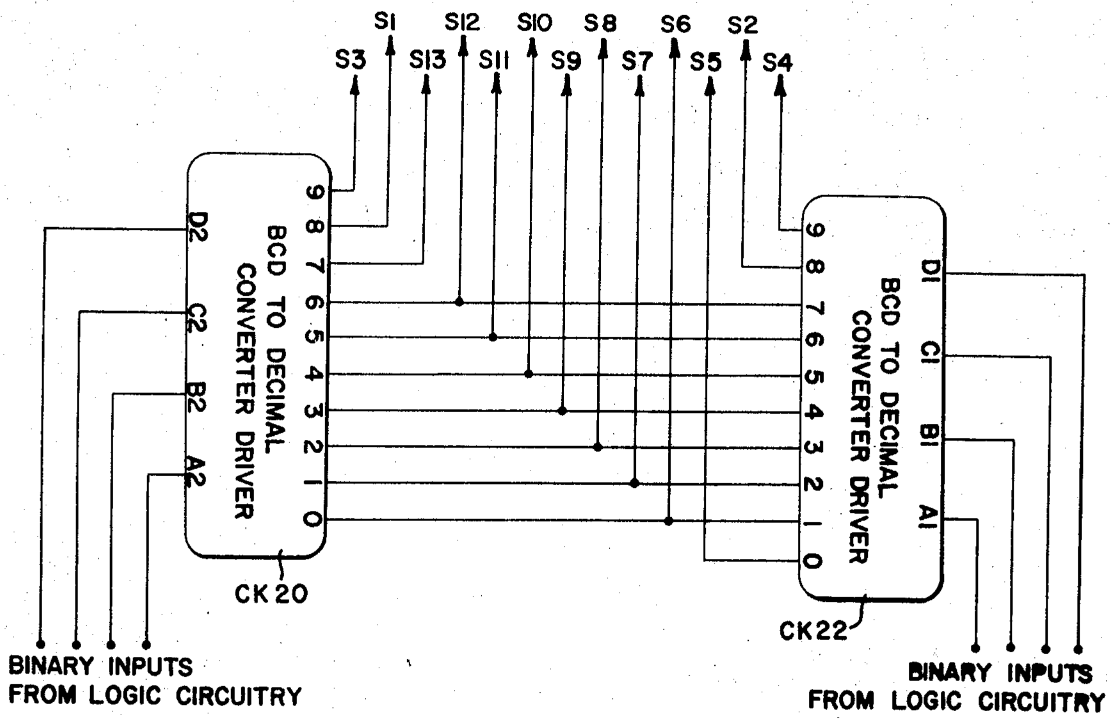
FIG. 4 is a block diagram representation of the circuitry for operating certain of the transformer switches shown in FIG. 2.
Figure 7:
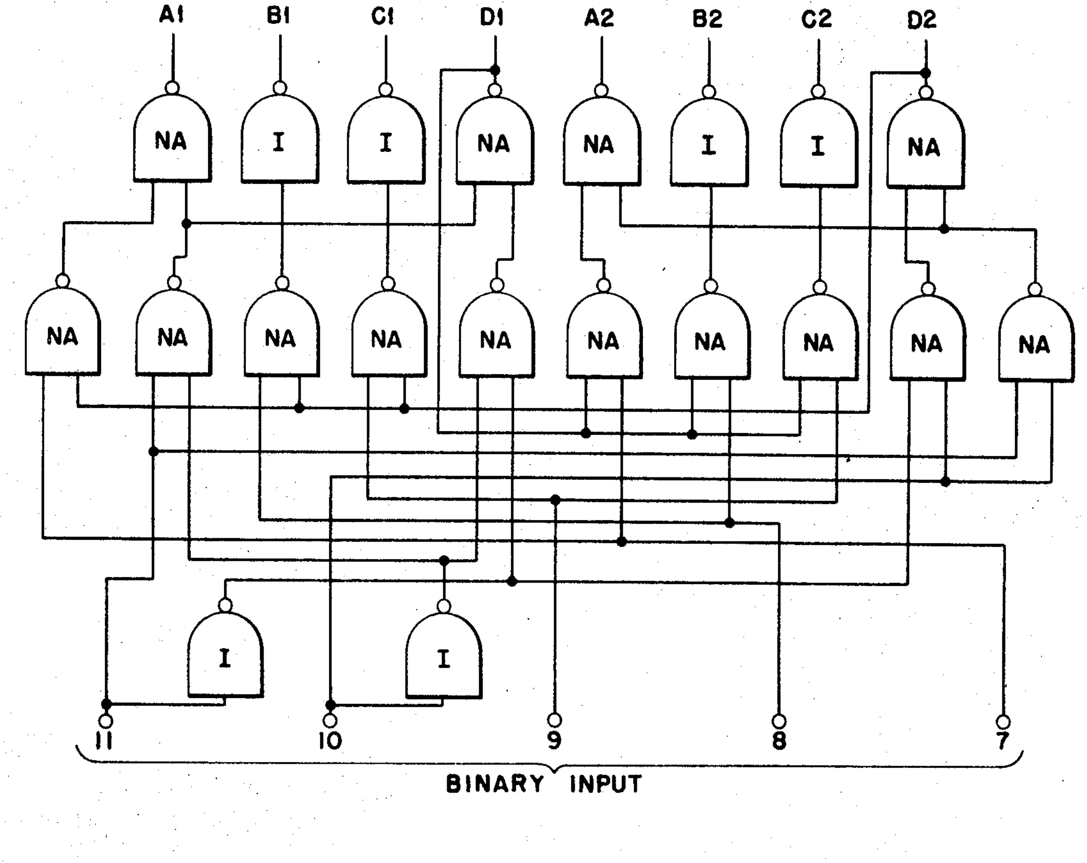
FIG. 7 is a diagrammatic illustration of the logic circuitry for converting a five-bit binary input to two four-bit binary outputs to control the switching for the primary transformer shown in FIG. 2.

The logic circuitry of the present invention is disclosed in FIGS. 4 and 7 with FIG. 8 comprising a truth table for the binary inputs to the transformer T1. The most significant five bits of the binary control signal (bits 7–11) are applied to the logic circuitry CK10 of FIG. 7, consisting of nand gates NA and inverters I interconnected as shown, in order to provide a pair of four-bit parallel binary outputs on lines A1–D1 and A2–D2. The truth table of FIG. 8 discloses the manner in which the logic of FIG. 7 is applied; for example, will all of the inputs being zero, all of the outputs will be zero with the exception of D1. With bit number 6 being in the "1" state and the remaining bits being 0, both D1 and A2 will be in the "1" state with the remaining outputs being zero. Thus the logic circuitry CK10 provides four-bit binary outputs which can be accepted by conventional BCD-to-decimal converters to control the switching elements.

FIG. 4 then shows the manner in which each of the four-bit binary inputs is presented to the BCD-to-decimal converters CK20 and CK22 so that a single signal on one of the leads 0–7 can be obtained for each binary input. The quadrant switches S1, S2, S3 and S4 are located on the "8" and "9" lead lines from the converters and will be activated by a binary representation of an "8" or a "9" at the input of one of the converters as shown in the truth table of FIG. 8. It will be seen that this condition, i.e., the activation of one of the quadrant switches, will exist for all input conditions. The remaining switches S4 through S13 are activated in accordance with the binary input to the converters which are, in turn, dependent upon the five-bit binary input from the digital control signal. For each input condition FIG. 8 also shows which quadrant switch will be actuated and which switch on the transformer T1 secondaries will be actuated.

A similar BCD-to-decimal converter driver CK24 or CK26 (FIG. 5) is used for translating the binary signal on each of the three bits used for indicating the incremental angles $\phi$ and $\zeta$. In this case the three-bit binary input is directly converted to a decimal equivalent by activation of one of the leads 0–7 for each input condition for application of the signal voltage at the base of one of the dual-emitter transistors.

A BCD-to-decimal converter/driver which will operate satisfactorily for the indicated circuit components CK20, CK22, CK24 and CK26 is a decoder/driver Type SN7441AN manufactured by Texas Instruments Inc. of Dallas, Texas.

It will be seen that the digital-to-resolver converter of the present invention is provided with a set of tapped transformers which are cross-connected in a unique manner so that incremental angles defined by selected portions of the digital input order may be added together to achieve the desired output angle on the windings of the resolver. This is achieved through the application of trigonometric principles which permit substantial simplification of the circuitry ordinarily necessary for obtaining an output with good resolution and, yet, which create only a negligible amount of error. Furthermore, the switching connections for the transformers are such that large transient voltages are not generated, and the circuitry will thereby be able to operate accurately and efficiently over long periods of time.

Although the best mode contemplated for carrying out the present invention has been herein shown and described, it will be apparent that modification and variation may be made without departing from what is regarded to be the subject matter of the invention.

What is claimed is:

1. A digital-to-resolver converter comprising a first transformer having a primary for receiving a fixed reference voltage input and a pair of secondaries with each secondary being provided with a plurality of taps, a switch provided in each of said taps, means for selectively simultaneously closing a selected switch to each of said secondaries, said last named means being arranged to receive a first portion of a binary digital order and to convert said portion to a signal to close said selected pair of switches such that one secondary will be provided with an analog voltage corresponding to the sine of a primary angle indicated by said digital order while the other secondary will be simultaneously provided with an analog voltage corresponding to the cosine of said primary angle, a second and a third transformer each having a primary winding electrically connected with one of said secondaries of said first transformer, each of said second and third transformers having a pair of secondary windings with a first secondary winding matching the number of turns in the associated primary winding and a secondary winding having a smaller number of turns than said primary winding and being provided with a plurality of taps, a switch provided in each of said taps of said second secondary windings, means for selectively simultaneously closing one switch to each of said second secondary windings, said last named means being arranged to receive a second portion of said binary digital order and to convert said portion to a signal to close a selected pair of said switches such that each of said second secondary windings are provided with an analog voltage corresponding to the tangent of an incremental angle indicated by said digital order times the analog voltage received from said first transformer, said first secondary windings of said second and third transformers being serially connected with the second secondary windings of said third and second transformers, respectively, whereby the outputs of said second and third transformers are analog voltages corresponding to the sine of the sum of said primary angle and said incremental angle and corresponding to the cosine of the sum of said primary angle and said incremental angle.

2. A digital-to-resolver converter according to claim 1 including fourth and fifth transformers each being provided with a primary winding electrically connected with one of the secondary windings of the second and third transformers, each of said fourth and fifth transformers having a pair of secondary windings with a first secondary winding matching the number of turns in the associated primary winding and a second secondary winding having a smaller number of turns than said primary winding and being provided with a plurality of taps, a switch provided in each of said taps of said second secondary winding of said fourth and fifth transformers, means for selectively simultaneously closing one switch to each of said second secondary windings of said fourth and fifth transformers, said last named means being arranged to receive a third portion of said binary digital order and to convert said portion to a signal to close a selected pair of said switches such that each of said second secondary windings are provided with an analog voltage corresponding to the tangent of a second incremental angle indicated by said digital order times the analog voltage received from said second or third transformers, said first secondary windings of said fourth and fifth transformers being serially connected with the second secondary windings of said fifth and fourth transformers, respectively, whereby the outputs of said fourth and fifth transformers are analog voltages corresponding to the sine of the sum of said primary angle and said incremental angles and corresponding to the cosine of the sum of said primary angle and said incremental angles.

3. A digital-to-resolver converter according to claim 1 wherein said transformer taps in the secondary windings of said second and third transformers are uniformly spaced along said second secondary windings.

4. A digital-to-resolver converter according to claim 1 wherein said switches comprise solid state bipolar elements having two separate and independent contacts with one in each of said secondary windings.

5. A digital-to-resolver converter according to claim 4 wherein each of said switches comprises a dual-emitter transistor biased in the grounded collector configuration with said signal being applied thereto at the base, and means for biasing said base in the absence of a digital order signal so that it is more positive than the maximum positive value of the reference voltage on the associated transformer winding.

6. A digital-to-resolver converter according to claim 5 wherein said means for selectively closing said switches comprises a binary to decimal converter and driver having a plurality of leads connected to the bases of said transistors, each of said leads being open when unactuated and being arranged to conduct current through said base biasing means when actuated to lower the voltage at said base to a negative value.

7. A digital-to-resolver converter comprising a first transformer having a primary for receiving a fixed reference voltage input and a pair of secondaries with each secondary being provided with a plurality of taps; a switch provided in each of said taps; means for selecting simultaneously closing a selected switch to each of said secondaries, said last-named means being arranged to receive a first portion of a binary digital order and to convert said portion to a signal to close said selected pair of switches such that one secondary will be provided with an analog voltage corresponding to the sine of a primary angle indicated by said first portion of the digital order while the other secondary will be simultaneously provided with an analog voltage corresponding to the cosine of said primary angle; a second and third transformer, the output of each secondary of said first transformer being center-tapped into the primary winding of one of said second or said third transformers; means for receiving a second portion of said binary digital order and converting it to analog voltages upon certain of the secondary windings of said second and third transformers such that the outputs of said second and third transformers are analog voltages corresponding to the sine of the sum of said primary angle and an incremental angle indicated by the second portion of said digital order and corresponding to the cosine of the sum of said primary angle and said incremental angle; one end of the primary winding of each of the second and the third transformers being connected through a first quadrant switch to ground and the other end of the primary winding of each of the second and the third transformers being connected through a second quadrant switch to ground; and means for connecting for simultaneous closure a selected pair of the four possible intertransformer combinations of quadrant switches whereby said analog voltages representing the sine and the cosine of the sum of said primary angle and incremental angle can be continuously obtained through a complete 360° cycle with one of said selected pairs of quadrant switches being closed during each quadrant of the cycle and such that said switching is accomplished from a secondary of the first transformer to a portion of one of the primary windings of the second and third transformers only when the voltage is zero on said portion in order to prevent the generation large transient voltages in switching, each of said quadrant switches comprising double-pole switches having one pole connecting an end of one transformer primary to ground and the other pole connecting an end of the other transformer primary to ground.

8. A digital-to-resolver converter according to claim 7 wherein each of said quadrant switches comprises a bipolar transistor biased in the grounded collector configuration and having a pair of emitters connected to the ends of said transformer primary windings, said signal being applied to said transistor at the base thereof.

9. A digital-to-resolver converter according to claim 8 including means for biasing said base of the transistor in the absence of a digital order signal so that it is more positive than the maximum positive value of twice the reference voltage.

10. In a digital-to-resolver converter comprising a first transformer having a pair of secondary windings, means for generating a voltage corresponding to the sine of a given angle on one of the secondary windings and for generating a voltage corresponding to the cosine of a given angle on the other secondary winding, a second and third transformer connected to receive respectively said generated voltages, and means for generating within one of said second and third transformers a voltage corresponding to the sine of the sum of said given angle and an incremental angle and for generating within the other of said second and third transformers a voltage corresponding to the cosine of the sum of said given angle and said incremental angle; the improvement comprising a plurality of spaced grounded taps in each of said secondary windings of the first transformer; a switch in each of said taps arranged to be selectively actuated by digital signals indicative of said sine and cosine of said given angle with said digital signals being defined by two voltage input levels with one of said levels being at ground potential; each switch comprising a bipolar transistor having its collector grounded and its base connected to receive said digital signals and being provided with a pair of emitters, one of said emitters being connected to one of the secondary windings of said first transformer and the other emitter being connected to the other secondary winding of said first transformer.

* * * * *